(12) United States Patent
Chen

(10) Patent No.: US 8,242,024 B2
(45) Date of Patent: Aug. 14, 2012

(54) METHOD OF FORMING METAL INTERCONNECTION ON THICK POLYIMIDE FILM

(75) Inventor: Chih-Chang Chen, Cupertino, CA (US)

(73) Assignees: Siargo Ltd., Santa Clara, CA (US); M-Tech Instrument Corp. Limited, Hong Kong (HK)

( * ) Notice: Subject to any disclaimer, the term of this patent is extended or adjusted under 35 U.S.C. 154(b) by 443 days.

(21) Appl. No.: 12/562,979

(22) Filed: Sep. 18, 2009

(65) Prior Publication Data

US 2011/0070742 A1    Mar. 24, 2011

(51) Int. Cl.
*H01L 21/302* (2006.01)
(52) U.S. Cl. ........ 438/712; 438/713; 438/717; 438/725; 438/734
(58) Field of Classification Search .................. 438/712, 438/713, 717, 725, 734
See application file for complete search history.

(56) References Cited

U.S. PATENT DOCUMENTS

| | | | | |
|---|---|---|---|---|
| 5,995,285 A * | 11/1999 | Unno | ............................ | 359/565 |
| 6,051,344 A * | 4/2000 | Langston et al. | ................. | 430/5 |
| 6,641,985 B2 * | 11/2003 | Unno et al. | .................... | 430/321 |
| 7,294,360 B2 * | 11/2007 | Maula et al. | .................. | 427/162 |
| 7,482,277 B2 * | 1/2009 | Barwicz et al. | ............... | 438/708 |
| 2003/0008245 A1* | 1/2003 | Iwasaki et al. | ................ | 430/321 |
| 2008/0283496 A1* | 11/2008 | Kido | .............................. | 216/49 |

* cited by examiner

*Primary Examiner* — Binh X Tran

(57) ABSTRACT

Many current micromachining devices are integrated with materials such as very thick layer of polyimide (10 to 100 um) to offer essential characteristics and properties for various applications; it is inherently difficult and complicated to provide reliable metal interconnections between different levels of the circuits. The present invention is generally related to a novel micromachining process and structure to form metal interconnections in integrated circuits or micromachining devices which are incorporated with thick polyimide films. More particularly, the embodiments of the current invention relates to formation of multi-step staircase structure with tapered angle on polyimide layer, which is therefore capable of offering superb and reliable step coverage for metallization among different levels of integrated circuits, and especially for very thick polyimide layer applications.

5 Claims, 5 Drawing Sheets

METHOD OF FORMING METAL INTERCONNECTION ON THICK POLYIMIDE FILM

BACKGROUND OF THE INVENTION

1. Field of the Invention

Figure 1:
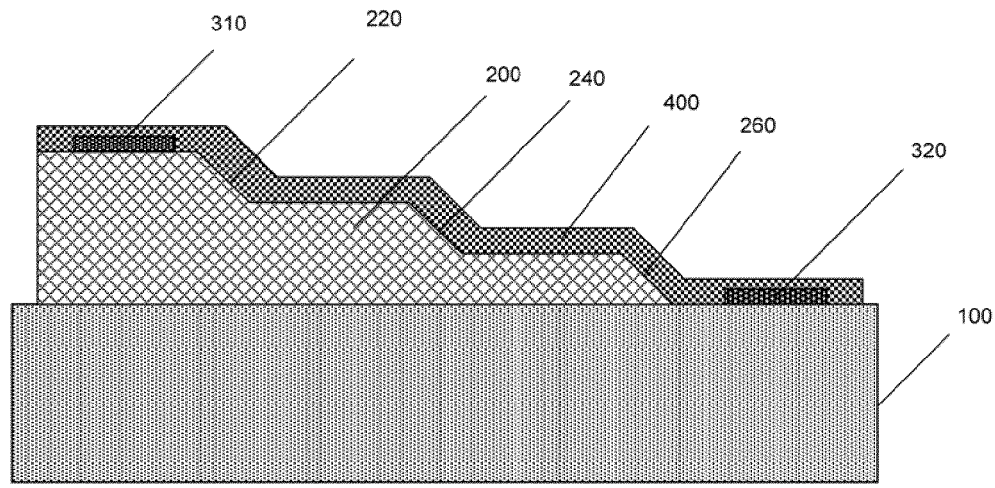

Polyimide is a polymeric plastic material. Due to its excellent engineered characteristics on thermal and chemical resistance as well as its stability for prolonged periods of time, it is widely applied in many demanding industrial applications such as electronics, aerospace, and electrical industries when a high temperature material is required. In many modern microelectronics and micromachining devices, the thin/thick films cured from applicable liquid polyimide have been broadly incorporated into various microstructures as an essential material.

The present invention discloses the details of a new method and process to form metal interconnections on micromachining devices which is integrated with thick polyimide films according to the preamble of the independent claims. It concerns to provide a reliable metallization method between circuits on polyimide and other layers by micromachining approach of manufacture. More particularly, the embodiments in the current invention will present micromachining techniques to form a multi-steps staircase structure with tapered angle on polyimide films, which can be applied to achieve good step coverage for metal interconnection among different level of circuits.

2. Description of the Related Art

Over the past few years, various prior arts related to slope etching of polyimide, and more particularly, to slope etching of polyimide for forming metallization method in an integrated circuit had been heretofore developed and disclosed.

The U.S. Pat. No. 4,832,788 (Method of Fabrication a Tapered Via Hole In Polyimide; by Michael H. Nemiroff, et al.) reveals a method of fabricating a tapered via hole in a polyimide layer by underlying a thin layer of silicon dioxide (SiO2) between photoresist and polyimide layer. The silicon dioxide (SiO2) layer combined with photoresist are used to create slope etching on polyimide by multi-stage plasma etching of these two film to enlarge the opening. However, its drawback is that the sidewall surface of the tapered step on polyimide would appear zigzag-like roughness which could cause discontinuity on metallization if the roughness is not controlled properly.

The U.S. Pat. No. 4,487,652 (Slope Etch of Polyimide; by Carl W. Almgren) teaches a method of fabricating a sloped via hole through polyimide by first sloping a hard mask which overlies the polyimide, and thereafter the sloped hard mask is used to slope the polyimide. The limitation of the revealed method is that the etching selectivity between oxide and polyimide is about 1 to 3. Therefore if the polyimide film is very thick like more than 1.0 um, then the corresponding thickness of oxide layer will need more than 3 um for the slope etching which is not feasible in reality. Moreover, in order to slope-etch the oxide layer, the overlaid photoresist needs reflow in which the process will cause the feature size change of via.

A wet etching method to generate etched slope on polyimide layer is revealed in the U.S. Pat. No. 4,369,090 (Process for Etching Sloped Vias in Polyimide Insulators; by Arthur M. Wilson et al.). Since the wet etching rate of polyimide films depends on its curing temperature and curing time, thus the sloped via could be achieved by etching through of several layers of partially cured polyimide. The slope angle of via could be indeed well controlled by this method; however, it is as well apparent that the complex curing process for different layer of polyimide is costly and infeasible in real applications.

Compared to aforementioned prior arts, the embodiments of the current invention will present simple and complete solutions to achieve reliable metallization on polyimide films, especially for those ultra thick of polyimide films incorporated in micromachining devices.

BRIEF SUMMARY OF THE INVENTION

There are two main objectives in the present invention. One objective is to provide an improved baking process which is applied to re-flow the photoresist as etching mask for plasma etchant to attain better tapered steps on polyimide films. Different than the conventional photoresist reflow process, the disclosed process of embodiments includes an extra preliminary baking step in lower temperature which can avoid changing the feature size of the patterned photoresist during the subsequent reflow baking step. To remain the feature size after photoresist reflow process is very crucial to many applications.

Another objective in the current invention is to provide a method and structure other than the conventional via holes, which can be applied to connect circuits in different levels separated by thick polyimide layers. A process to form a multi-step staircase structure for metallization will be revealed in the embodiments of the present invention to achieve this objective. The disclosed structure in the present invention is especially useful and suitable for very thick polyimide layers (>10 um) applications.

BRIEF DESCRIPTIONS OF THE DRAWINGS

FIG. 1 illustrates a completed metallization on a three-step staircase structure to connect between two levels of circuits which are on top surface of polyimide and on top surface of substrate surface respectively.

Figure 2:
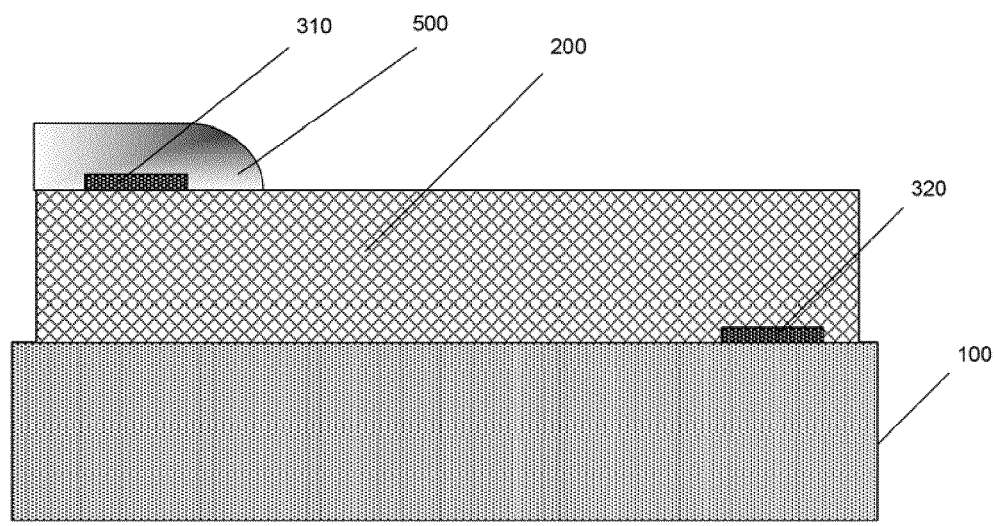
Figure 2:
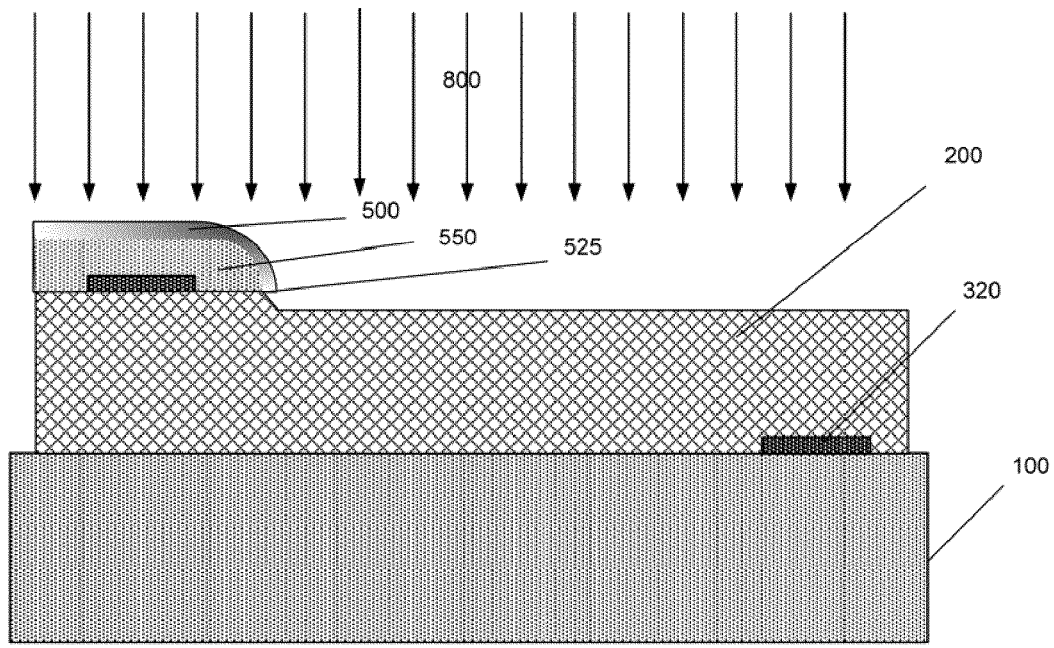
Figure 2:
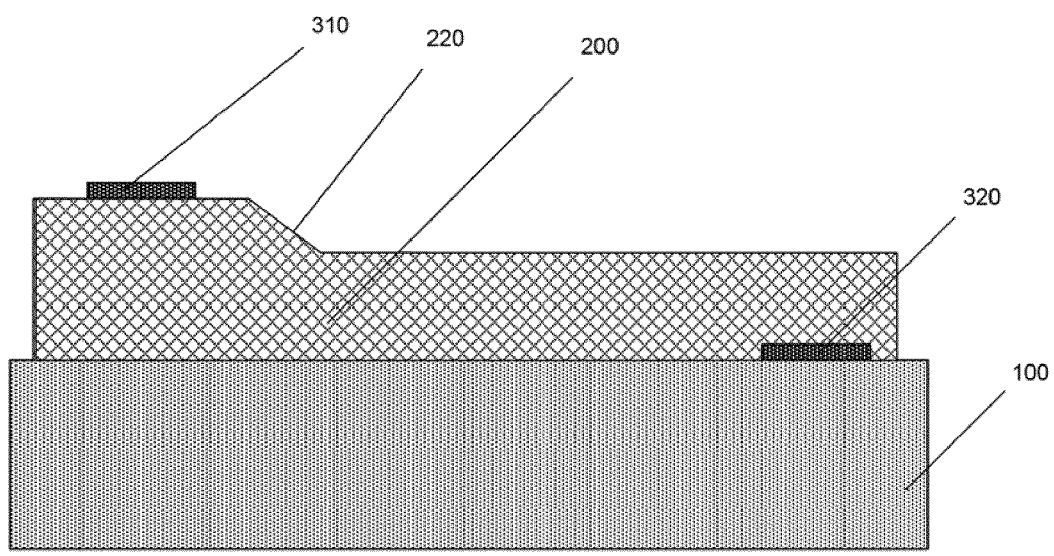
Figure 2:
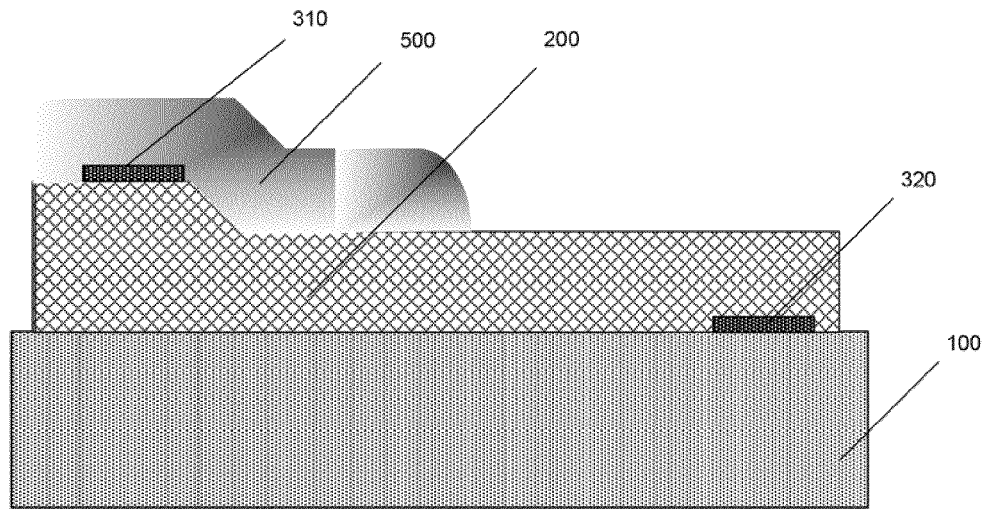
Figure 2:
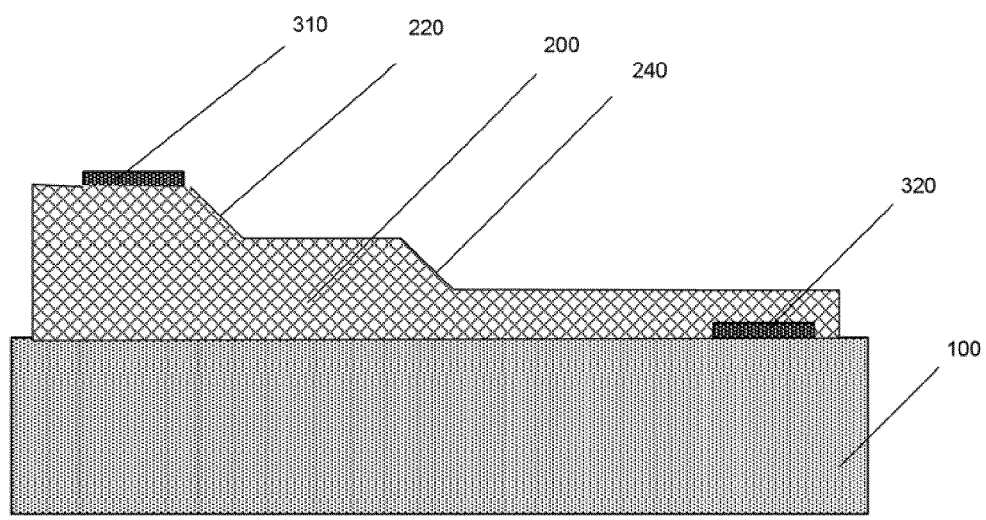
Figure 2:
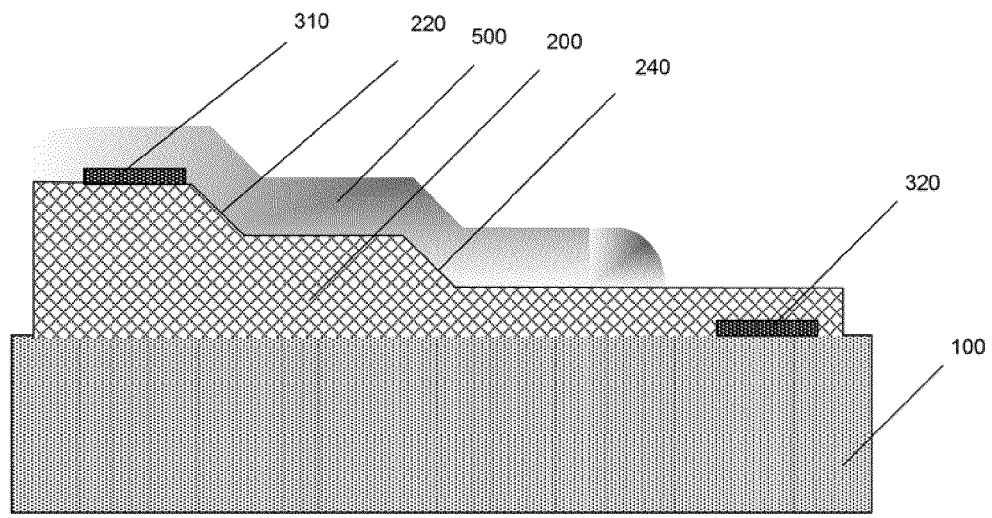
Figure 2:
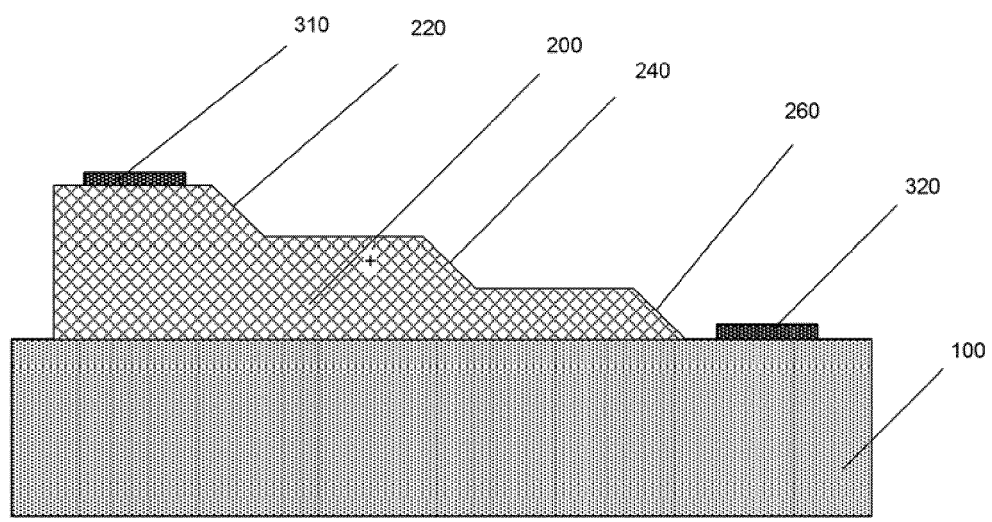

FIG. 2 (a) to FIG. 2 (g) shows a process for forming a micromachining structure which has three-step staircase structure for metallization according to the preferred embodiment in the current invention.

Figure 3:
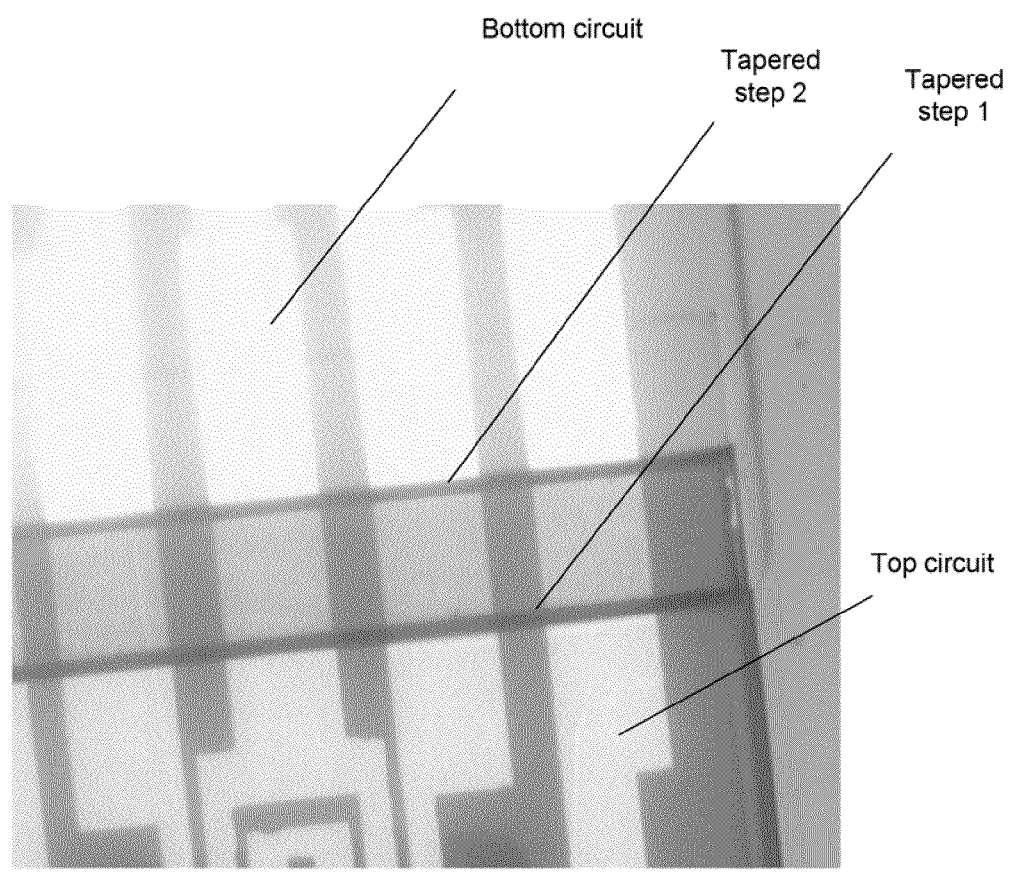

FIG. 3 is a picture to demonstrate the metallization of staircase structure with two tapered steps in a real application.

DETAILED DESCRIPTION OF THE PREFERRED EMBODIMENTS

FIG. 1 illustrates a cross sectional view of preferred metallization topology between two separate levels of circuits in the current invention. The top level of circuit (310) is on the top surface of polyimide (200) and the bottom level of circuit (320) is on the top surface of substrate (100). This figure demonstrated a three-step (220,240,260) of staircase structure with tapered angle on a thick layer of polyimide (200). The metallization (400) layer has very good step coverage between two levels of circuits due to the tapered angle in each step. The number of the steps on staircase structure is depending on the thickness of polyimide layer. In general, according to the current embodiments of invention, a three-steps-staircase structure would be suitable for a 30 um thick of polyimide layer.

From FIG. 2 (a) to FIG. 2 (g), the figures demonstrate a process for forming a micromachining structure which has three steps of staircase for metallization according to the preferred embodiment of the present invention.

Referring to FIG. 2 (a), the low level circuit 320 had been produced in advance on top surface of substrate while the top level circuit 310 is formed on top surface of polyimide thereafter the polyimide film 200 had been spun on substrate and cured in oven. The thickness of polyimide could be varied in a large range from 1 um to 100 um depending on various applications. In the current demonstration, the thickness of cured polyimide film is about 30 um.

The process to form a tapered angle on polyimide etching profile will be demonstrated as following. A 10 um thick photoresist such as SPR220-7 from MicroChem had been spun on top of polyimide as etching mask for polyimide plasma etching. Before the UV exposure on photoresist, the photoresist needs to bake in a 90° C. convention oven for 60 minutes. Thereafter the baking process in convention oven, the photoresist will be exposed and developed subsequently.

A hard baking procedure for the thick photoresist afterwards is essential and critical to the formation of tapered angle in etching profile of the polyimide film. The hard baking process is including two separate baking steps at two different temperatures: the first step is to bake the photoresist in 90° C. convention oven for 30 minutes, and then the second baking step is to bake the photoresist in 110° C. convection oven for another 30 minutes. The first step of hard baking in 90° C. convection oven is very critical to avoid the shrink of the featured photoresist pattern affected by the subsequent hard baking process in 110° C. convection oven. The purpose of the second step hard baking in 110° C. convection oven is to reflow the thick photoresist, therefore the edge profile of the photoresist will be transformed to be a more gradual slope from vertical angle, which will be then transferred to be the etching profile of polyimide film. It is to emphasize again that since the reflow process of hard baking in 110° C. oven will change the feature size of patterned photoresist, therefore a preliminary step to bake photoresist in a lower temperature oven (90° C.) is necessary and critical.

Referring to FIG. 2 (b) and FIG. 2 (c), the first tapered step on polyimide is formed by high density oxygen inductive coupled plasma (ICP) (800) etching. The forming process and principle of tapered step in etching process is as shown. Because of the previous reflow process on photoresist, a gradual slope is generated on the edge profile of photoresist (500). Since the oxygen plasma (800) will not only etch polyimide film but the photoresist as well, hence the thinner portion of photoresist will be simultaneously etched away to form a etching back (525) on the front edge of photoresist. The etching back on photoresist will cause the polyimide originally, covered by photoresist to be uncovered again, and thus expose to oxygen plasma (800) for etching. As a result of continuous etching back on photoresist, the tapered step structure on polyimide will be formed eventually like a reverse image of the reflowed photoresist (500). The oxygen plasma etching is performed under coil power of 600 Watt with oxygen flow of 40 sccm at 30 mtorr of chamber pressure. In order to reduce the roughness of etched surface, the platen power to enhance the ion bombardment is recommended to turn off.

The slope of the tapered step will pretty much depend on the etching time and the etching selectivity between polyimide and photoresist. The longer etching time, the slower slope is. However, the allowed etching time is very much limited by the thickness of the photoresist since it is consumed in the same time during the etching process. The etching selectivity to the oxygen plasma between polyimide and SPR220-7 is near 1 to 1. Therefore for a very thick layer of polyimide case, a multi-step of staircase structure for the metallization will be introduced in the current invention.

From FIG. 2 (d) to FIG. 2 (g), the photolithography and oxygen plasma etching process are repeated as demonstrated from steps of FIG. 2 (a) to FIG. 2 (c) except that the photo masks used in each tapered step are different.

The picture in FIG. 3 shows the current embodiment in a micromachining device with multi-step staircase structure to connect the top circuit on polyimide with the bottom circuit on substrate. The thickness of polyimide layer in the picture is about 20 um.

According to the foregoing preferred embodiments, a simple and reliable process and method for metallization on different levels of circuits integrated with polyimide is disclosed in details. While the invention has been described in terms of what are presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. In a substrate having a polyimide layer overlying on an substrate with an existing integrated circuit, wherein the polyimide layer having another integrated circuit on its top surface, a method of forming a multi-step staircase structure with each step tapered on the polyimide layer for metal interconnection between said two integrated circuits comprising of the following steps:

disposing a layer of photoresist;

applying a first photo mask to expose the photoresist with UV light and then be developed to form a photoresist pattern;

a preliminary baking process on the photoresist pattern with the substrate in an convection oven at 90° C. for 30 to 50 minutes;

a secondary baking process on the photoresist pattern with substrate in an convection oven at 110° C. for 30 to 50 minutes;

applying an inductively coupled reactive ion etching of oxygen plasma to the polyimide layer using photoresist pattern as an etching mask;

stripping the photoresist; and repeating above process with corresponding photo masks to form multi-step staircase structure by etching other tapered steps in the thickness direction until undesired portion of the polyimide layer on the substrate is completely etched, and the integrated circuit on the substrate is exposed.

2. The method of claim 1 wherein:

number of steps on the multi-step staircase on the polyimide layer is depended on thickness of the polyimide layer and photoresist; the etching selectivity between polyimide and photoresist is about 1 to 1; wherein in the case of 30 um thick of polymide with a photoresist thickness of 10 um thick for each etching, the polyimide will need three times of etching to form the multi-step staircase structure with three tapered steps; or wherein with a photoresist is thickness of 15 um for each etching, the polyimide will only need twice of etching to form the multi-step staircase structure with two tapered steps.

3. The method of claim 1 wherein:

the preliminary baking process in a lower temperature is applied to prevent feature size of the photoresist pattern changed, during the following the secondary baking step.

4. The method of claim 1 wherein:
the secondary baking step is applied to reflow the photoresist to gain a gradual slope on photoresist edge profile.

5. The method of claim 1 wherein:
the inductively coupled reactive ion etching of oxygen plasma is generated under coil power of 600 Watt with oxygen flow of 40 sccm at 30 mtorr of chamber pressure; in order to reduce roughness of etched surface, platen power to enhance ion bombardment has to be turned off.

* * * * *